(12) United States Patent
Yang et al.

(10) Patent No.: US 7,099,400 B2
(45) Date of Patent: Aug. 29, 2006

(54) MULTI-LEVEL PULSE AMPLITUDE MODULATION RECEIVER

(75) Inventors: Fuji Yang, Holmdel, NJ (US); Michael L. Craner, Exton, PA (US)

(73) Assignee: Agere Systems Inc., Allentown, PA (US)

(*) Notice: Subject to any disclaimer, the term of this patent is extended or adjusted under 35 U.S.C. 154(b) by 706 days.

(21) Appl. No.: 10/348,877

(22) Filed: Jan. 22, 2003

(65) Prior Publication Data

US 2004/0141567 A1 Jul. 22, 2004

(51) Int. Cl.
*H04L 25/34* (2006.01)
*H04L 25/49* (2006.01)

(52) U.S. Cl. .................................. 375/287; 375/294

(58) Field of Classification Search ............... 375/286, 375/287, 293, 294, 353; 370/533
See application file for complete search history.

(56) References Cited

U.S. PATENT DOCUMENTS

| | | | | |
|---|---|---|---|---|
| 3,988,676 A | * | 10/1976 | Whang | 375/293 |
| 5,602,879 A | * | 2/1997 | Wada | 375/355 |
| 6,456,677 B1 | * | 9/2002 | Hiramatsu et al. | 375/354 |
| 2002/0196510 A1 | * | 12/2002 | Hietala et al. | 359/189 |

* cited by examiner

Primary Examiner—Don N. Vo

(57) ABSTRACT

Multiple-level phase amplitude (M-PAM) clock and data recovery circuitry uses information from multiple phase detectors to generate one or more data sampling clocks that are optimized for each of the data slicers. One possible 4-PAM implementation includes 3 data slicers, 3 edge slicers, 3 phase detectors, and a single VCO. The phase detector outputs are combined (e.g., via weighted voting, weighted average, minimum error, and/or minimum variance) to determine an optimized phase estimate for the clock used to sample the data at all three data slicers. Another 4-PAM implementation similarly includes 3 data slicers, 3 edge slicers, 3 phase detectors, and a single VCO. The mid-amplitude edge slicer and phase detector are used in combination with the VCO to generate a central phase while a multiple-tap delay line provides N phase variants before and after the central phase. Information from the non-mid-amplitude edge slicers and phase detectors is used to choose a phase from among the phase variants that best suits the other data slicers. In yet another implementation, a single edge slicer, single phase detector, and single VCO is used to generate a key clock which is used by the edge slicer to track the symbol timing. A clock generator provides a single optimized clock (that is offset from the key clock) that is used by the data slicers. Bit error rates from the data slicers are used to adjust the offset until the data slicer clock is optimized with respect to all the slicers. Alternatively, multiple clocks are generated via offsets from the key clock, each being optimized to the data slicer group that it drives.

18 Claims, 11 Drawing Sheets

TABLE 1

| ROW# | A (A) | B (T) | C (B) | D (UP) | E (DN) | COMMENT |
|---|---|---|---|---|---|---|
| 1 | 0 | 0 | 0 | 0 | 0 | DON'T CARE |
| 2 | 0 | 0 | 1 | 1 | 0 | FAST/EARLY |
| 3 | 0 | 1 | 0 | 0 | 0 | DON'T CARE |
| 4 | 0 | 1 | 1 | 0 | 1 | SLOW/LATE |
| 5 | 1 | 0 | 0 | 0 | 1 | SLOW/LATE |
| 6 | 1 | 0 | 1 | 0 | 0 | DON'T CARE |
| 7 | 1 | 1 | 0 | 1 | 0 | FAST/EARLY |
| 8 | 1 | 1 | 1 | 0 | 0 | DON'T CARE |

MULTI-LEVEL PULSE AMPLITUDE MODULATION RECEIVER

BACKGROUND OF THE INVENTION

1. Field of the Invention

The present invention relates to clock and data recovery systems and, more specifically, to M-level pulse amplitude modulation (M-PAM) receivers.

2. Description of the Related Art

M-level pulse amplitude modulation (M-PAM) is a modulation technique that can be employed to reduce bandwidth requirements in data communication systems. Generally, an M-PAM transmitter modulates a carrier with one of M different amplitude levels per symbol, allowing $\log_2 M$ bits of data to be transmitted per symbol interval. 4-PAM is a subset of M-PAM where a carrier is modulated with one of 4 different amplitude levels per symbol, allowing 2 bits of data to be transmitted per symbol interval. 2-PAM corresponds to the common bi-level or binary modulation scheme.

Data recovery of a transmitted M-PAM signal at a receiver is typically achieved using M−1 data slicers, an edge slicer, a phase detector, and a clock recovery circuit. A slicer compares an input signal with a reference signal and outputs one logic level when the input signal exceeds the reference, and another logic level if the input does not exceed the reference. A slicer is typically implemented with a voltage comparator, an amplifier, and a D-type flip-flop (D-FF). The voltage comparator compares an input signal with a reference voltage and outputs one voltage (typically close to the positive rail or supply voltage of the voltage comparator) when the input signal exceeds the reference, and another voltage (typically close to zero volts in a non-differential implementation or the negative rail or supply voltage in a differential implementation) if the input does not exceed the reference. The output of the voltage comparator is fed to the amplifier, where its amplitude is adjusted to a range appropriate to the D-FF. The output of the amplifier is then sampled by the D-FF. M−1 threshold voltages corresponding to the M−1 data slicers are distributed evenly between the M symbol amplitude levels of the modulated carrier in an interleaved fashion, ideally with each threshold centered between two adjacent symbol amplitude levels. The edge slicer shares the voltage comparator and amplifier of one of the data slicers. It has, therefore, effectively the same reference voltage as that data slicer. The D-FFs of the data slicers sample on the edges of a locally generated clock that are estimated to occur approximately in the middle of the symbol intervals, and the D-FF of an edge slicer samples on edges of a locally generated clock that are estimated to occur near the edge of the symbol intervals. The data slicer whose comparator and amplifier are shared with the edge slicer is typically one of the middle amplitude slicers, since statistically, more level transitions occur through a middle slicer's amplitude region and thus the edge slicer will have more opportunities for measuring the relative phases of the symbol transition edges. The output of the edge slicer, along with estimates of the data values before and after a given symbol edge, are used by the phase detector to make early or late determinations about the local sampling clock and make adjustments to its phase via a phase feedback loop within the clock recovery circuit (e.g., via a charge pump and voltage controlled oscillator).

In a 4-PAM receiver, for example, 3 data slicers and 1 edge slicer are used. The data slicers' reference voltages are set between the four modulated levels of the 4-PAM signal corresponding to the Gray encoded bit patterns {00, 01, 11, 10}. Here 00 corresponds to the lowest modulation amplitude of the 4-PAM signal, 10 corresponds to the highest modulation amplitude of the 4-PAM signal, and 01 and 11 correspond to the mid-low and mid-high modulation amplitudes, respectively. The edge slicer shares the comparator, amplifier, and reference voltage of the data slicer whose reference voltage is set between the 01 and 11 modulation levels (i.e., the mid-amplitude slicer). The data slicers slice the received 4-PAM signal roughly in the middle of the symbol interval based on an edge (e.g., the rising edge) of a locally recovered symbol period clock. The edge slicer slices the received 4-PAM signal at the estimated times of 01-11 and 00-10 transitions based on an edge (e.g., the falling edge) of that locally recovered symbol period clock. The outputs of the data slicers are processed to produce the recovered data stream, and the output of the edge slicer is used (in combination with the corresponding data slicer's output and the recovered data) in a phase detector and clock recovery circuit to adjust the phase of the recovered clock. An example phase detector used in such an application is a bang-bang phase detector as discussed in Alexander, J. D. H, "Clock Recovery From Random Binary Signals," Electronic Letters, vol. 11, pp.541–542, October, 1975 (herein "Alexander"), incorporated herein by reference in its entirety.

Until now M-PAM (M>2) signaling has been successfully used in various data communication systems, with data rate below 2.5 Gb/s. Employing 4-PAM signaling in high speed serial communication (>2.5 Gb/s) has recently begun to emerge in order to increase the bandwidth efficiency of these systems. As an example, an 8 Gb/s serial transceiver has recently been developed using 4-PAM signaling. As the data rate increases, 4-PAM receivers begin to suffer from delay mismatch errors introduced in the three slicers, which limit the receiver's performance and reduce the timing margin. Slicer delay is defined as the time it takes a signal to propagate through the comparator, amplifier, and other circuitry of a slicer before being sampled by the slicer's D-FFs. In the design of a conventional 4-PAM receiver, each slicer exhibits a unique slicer delay. At data rates on the order of 8 Gbps, given current chip technology, the slicer delay is still small relative to the symbol period and the slicer delay differences are tolerable. At higher data rates (i.e., 10 Gb/s or higher), however, where the slicer delay differences become significant compared to the symbol interval, mismatch between slicer delays can significantly reduce the receiver's timing margin and can cause data recovery to fail in the presence of jitter on the incoming data or on the recovered clock. This is because the locally generated slicer clock (whose phase is a function of the slicer delay of the slicer to which the edge D-FF is associated) may not be aligned properly for one or more of the other data slicers (whose ideal sampling opportunities are a function of other slicer delays). Thus one or more of the data slicers may slice outside of the optimum valid data region for a symbol, (potentially with insufficient setup or hold time relative to a data transition), which may result in errors in the recovered data. Chip designers' attempts to match the slicer delays by various techniques, in addition to matching the clock buffer, clock path, and signal path delays to the slicers, have heretofore provided limited improvement in the achievable data rate of M-PAM systems.

SUMMARY OF THE INVENTION

To address the above-discussed deficiencies of the prior art, according to one embodiment of the invention, M-level pulse amplitude modulation (M-PAM) receiver circuitry includes M−1 data slicers, N edge slicers and P phase detectors (1≦P≦N≦M) where the outputs of the P phase detectors are combined (e.g., via weighted voting, weighted average, minimum error, and/or minimum variance) to determine an improved phase estimate for the slicers' clocks.

In another embodiment, C clock generation circuits (each of which is associated with one or more of the P phase detectors where C≦P) are used to generate an independent clock phase for each of C groups of slicers (where C≦N) such that the clock phase associated with each group of slicers is matched to the slicers within that group.

In yet another embodiment, each of R clock generation circuits outputs $r_i$ clock phases such that any one of the resulting Q phases, where:

$$Q = \sum_{i=1}^{R} r_i, \quad (1)$$

can be selected to drive any one or more of the C groups of slicers (C≦Q).

In yet another embodiment, one edge slicer feeds a phase detector that feeds a central multiphase clock recovery circuit. The multiphase clock recovery circuit, in combination with a startup controller and selection logic, selects the best phase for each slicer. The best phase is determined using information derived during a controlled reception scenario, for example, a special interval during which a calibration or training sequence is received either from the remote transmitter or via a local loopback path.

In yet another embodiment, a central edge slicer, phase detector, charge pump, and VCO are used to generate a single clock source that feeds a multiple-tap delay line. The phase of the middle tap in the delay line is used as the clock for the edge and data D-FFs of the central slicer, resulting in alignment of the middle tap to the symbol as seen by the central slicer. Edge slicers and phase detectors from each of the non-central slicers feed a selection circuit which selects a best tap of the delay line for each of these non-central slicers.

In yet another embodiment, the present invention is an apparatus for processing an M-level signal, (M>2), that includes (a) a plurality of data slicers, each adapted to data sample the M-level signal relative to a threshold level between a different adjacent pair of symbol levels, (b) two or more edge slicers, each adapted to edge sample the M-level signal relative to a threshold level between a different adjacent pair of symbol levels, and (c) a clock generator adapted to generate at least one clock signal based on outputs from the two or more edge slicers, wherein the at least one clock signal determines the timing of the data sampling of the M-level signal by at least one of the plurality of data slicers.

In yet another embodiment, the present invention is a method for processing an M-level signal, M>2, comprising data sampling the M-level signal relative to each of a plurality of threshold levels, each threshold level between a different adjacent pair of symbol levels in the M-level signal, edge sampling the M-level signal relative to each of two or more threshold levels using two or more edge slicers, each threshold level between a different adjacent pair of symbol levels; and generating at least one clock signal based on outputs from the two or more edge slicers, wherein the at least one clock signal determines the timing of the data sampling of at least one of the M-level signals.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

4-PAM Receiver

Figure 1:
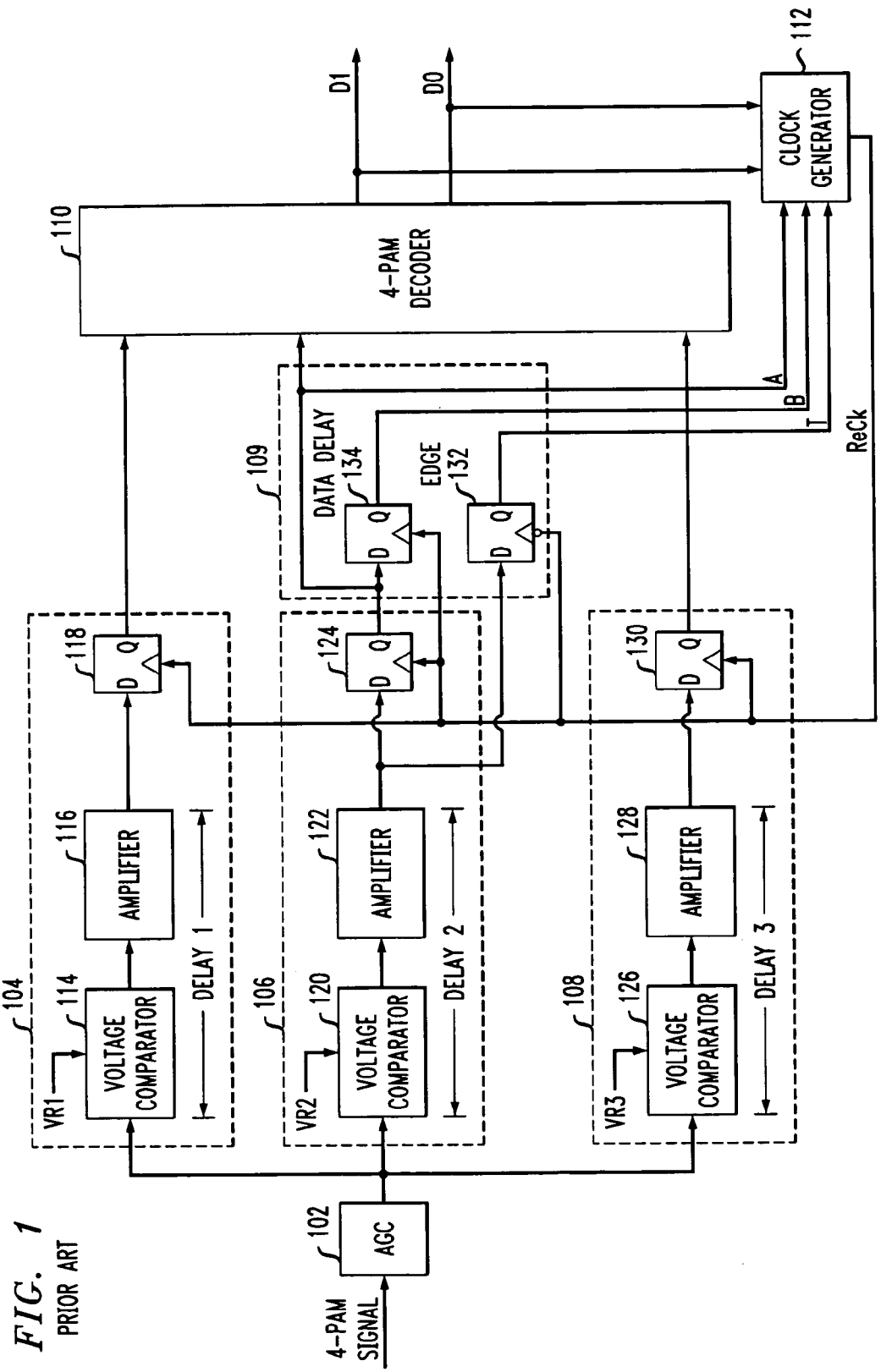
FIG. 1 is a block diagram of a 4-PAM receiver of the prior art.

FIG. 1 is a block diagram of a 4-level pulse amplitude modulation (4-PAM) receiver of the prior art. It includes a data recovery circuit comprising automatic gain controller 102, slicers 104, 106, and 108, and 4-PAM decoder 110. It also includes a local clock recovery circuit that includes data delay and edge D-FFs 109, and clock generator 112.

Data Recovery Circuit

At the input to the receiver, a 4-PAM input signal is first gain adjusted by automatic gain controller 102 before being split three ways to feed slicers 104, 106, and 108.

In slicer 104, the gain-controlled input signal is compared with a reference voltage VR1 at voltage comparator 114. The voltage comparator outputs a differential signal of one value when the input signal exceeds VR1, and it outputs a differential signal of another value when the input does not exceed VR1. The output of the comparator is fed to differential amplifier 116 where it is amplitude adjusted for conformance with the input requirements of the differential D-type flip-flop (D-FF) 118. The output of the amplifier is sampled by D-FF 118 on the rising edge of the locally recovered clock (ReCk) and then output to 4-PAM decoder 110. Similarly, in slicer 106, the input signal is compared to reference voltage VR2 by voltage comparator 120 and the output is then amplified (122), sampled (124), and fed to 4-PAM decoder 110. Likewise, in slicer 108, the input signal is compared (126) with reference voltage VR3, amplified (128), sampled (130), and output to 4-PAM decoder 110. The three data slicers' outputs are processed by 4-PAM decoder 110 to produce an estimate of the two-bit symbol [D1 D0] that was transmitted. This estimate corresponds to one of the Gray encoded bit patterns {00, 01, 11, 10}.

Clock Recovery Circuit

In contrast to the other slicers, the output of D-FF 124 of slicer 106, additionally feeds data delay D-FF 134, and the output of amplifier 122 of slicer 106 also feeds edge D-FF 132. The outputs of these D-FFs, differential signals B and T, respectively, along with the output of slicer 106, signal A, and the recovered data bits [D1 D0] out of 4-PAM demodulator 110 are fed to clock generator 112 as part of the clock recovery process. Data delay D-FF 134 samples on the rising edge of ReCk corresponding to the estimated middle of the symbol interval while edge D-FF 132 samples on the falling edge of ReCk corresponding to the estimated edge of the symbol interval.

Signal A indicates to the phase detector whether the current sample of slicer 106 is above or below VR2. Signal B is a copy of signal A delayed by one symbol interval. It indicates whether the last sample of the output of slicer 106 was above or below VR2. Signal T (where T stands for "timing") indicates the value of the amplifier output of slicer 106 just prior or just after to the edge of the symbol interval. If A and B are different, a transition has occurred between them and thus T may be able to be used to determine if ReCk was early or late with respect to the transition. If T matches A, it is early, if T matches B, it is late. This early or late information is used by clock generator 112 to adjust ReCk so that its falling edge is closely aligned to the edge of each symbol interval, and as a result, its rising edge is closely aligned to the middle of the symbol interval (assuming a 50/50 duty cycle for ReCk).

Selecting Transitions

Figure 2:
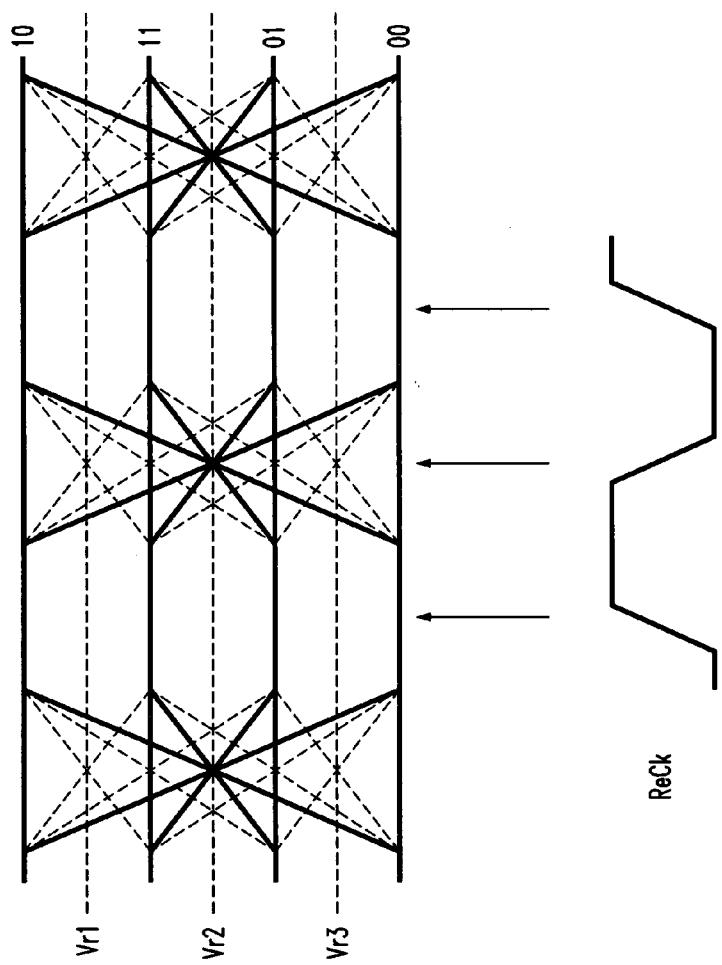
FIG. 2 is a 4-PAM symbol transition diagram.

FIG. 2 illustrates the data transitions and plateaus that occur in a conventional 4-PAM system and the relationship of ReCk to those transitions and plateaus. It also illustrates the position of the reference voltages (i.e., VR1, VR2, and VR3) used by the comparators of the 4-PAM receiver of FIG. 1 relative to the plateaus of the modulation. From this figure, it can be seen that only certain transitions are useful for phase alignment of ReCk for the conventional 4-PAM receiver with respect to VR2. The useful transitions must cross the VR2. For example 00⇔01 and 11⇔10 transitions do not cross VR2 and thus they cannot be used in the clock recovery using the conventional 4-PAM receiver. The clock recovery circuit ignores these transitions since they don't result in a change between signals A and B, and thus provide no useful transition information for phase alignment purposes. Further 00⇔11 and 01⇔10 transitions do cross VR2, but not at the exact edge of the symbol interval. These transitions also are ignored since if they were used, they would add error to the phase calculation. This leaves only 01-11 and 00-10 transitions to be used for alignment of ReCk. In order to determine which transitions to keep and which to ignore, the phase detector looks at signals A, B, and T as well as the current and the last symbols values [D1 D0] out of the 4-PAM decoder. One disadvantage of the design of the receiver of FIG. 1 is that the recovered clock is only optimized for slicer 106. The recovered clock is optimally placed for data pattern 01-11, 11-01, 00-10 and 10-00, as these pattern contain the transition used by the phase detector. For other data patterns, the system relies on the delay matching between slicers 104, 106, and 108 for phase alignment to the data from slicers 104 and 108. Any delay mismatch will offset the recovered clock from its optimal sampling point for slicers AB and AC. Furthermore, as many of the transitions are ignored, each of these ignored transitions can be viewed as an opportunity for improving the phase alignment of the recovered clock. Statistically, then, fewer opportunities will lead to poorer phase alignment and a poorer clock and data recovery system than if these other transitions could be utilized in an appropriate way.

Figures 3, 4:
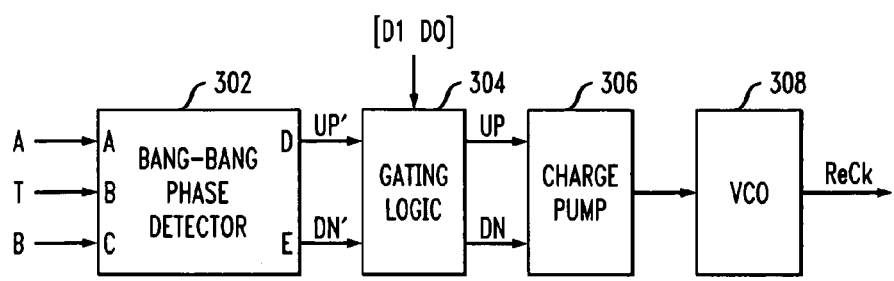
FIG. 3 is a block diagram of clock generator 112 of FIG. 1.
FIG. 4 is the truth table for the logic of bang-bang phase detectors 302 of FIG. 3, 702, 704, and 706 of FIG. 7, and 1204, 1216, and 1218 of FIG. 12.

FIG. 3 illustrates the elements of clock generator 112 of FIG. 1. As shown, bang-bang phase detector 302 receives signals A, B, and T and generates UP' and DN' control signals according to the TABLE 1 of FIG. 4 (in accordance with the teachings of Alexander). The signals are gated by gating logic 304 before being passed to charge pump 306. In response to the input UP and DN signals from gating logic 304, charge pump 306 provides a control voltage to VCO 308 that controls the phase of the locally recovered clock ReCk. More details on bang-bang phase detectors and clock recovery loops can be found in Alexander. To avoid overcomplicating the discussion, the details of registration and use of the recovered data [D1 D0] in gating logic 304 to eliminate certain transitions from use in the generation of UP and DN pulses as discussed previously, is not illustrated by the table, but would be understood to one versed in the art.

Slicer Delay Differences

As illustrated in FIG. 1, each of the comparator and amplifier portions of the slicers exhibits its own unique propagation delay. Slicer 104 has delay 1, slicer 106 has delay 2, and slicer 108 has delay 3. The differences between these delays can be due to parasitic capacitance effects, trace routing differences, component trim differences, etc. These delays affect the relative times at which the input 4-PAM signal is seen at one or more of the D-FFs of each of the slicers. This can be better understood by referring to FIG. 5. Here the intersection of two lines in the form of an X is used to represent the center of a locus of transitions associated with the edge of a symbol as viewed by a given slicer. For example, intersection 502 represents the leading edge of a received symbol as seen by data D-FF 118 of slicer 104 of FIG. 1. Similarly, intersection 506 represents the leading edge of the same received symbol as seen by data D-FF 130 of slicer 108 of FIG. 1. Note that for slicer 106, intersection 504 represents the leading edge of the same symbol as seen by not only data D-FF 124 but also edge D-FF 132. Correspondingly, the falling edge of ReCk is depicted as ideally aligned to the leading edge of the symbol as seen by slicer 106 (represented by intersection 504 of FIG. 5). Because of the slicer delay differences, there are time differences between the falling edge of ReCk (a function of the slicer delay of slicer 106) and the symbol edges as perceived by the other slicers (a function of their unique slicer delays). These differences (508) illustrate another significant deficiency of the prior art. As the data rate of the system increases, the delay differences become significant relative to the symbol interval. The result is that one or more of slicers 104 or 108 may end up sampling the data outside of the plateau region or with insufficient setup or hold time relative to a data transition, and data recovery will fail.

Multiple Edge Slicers

Figure 6:
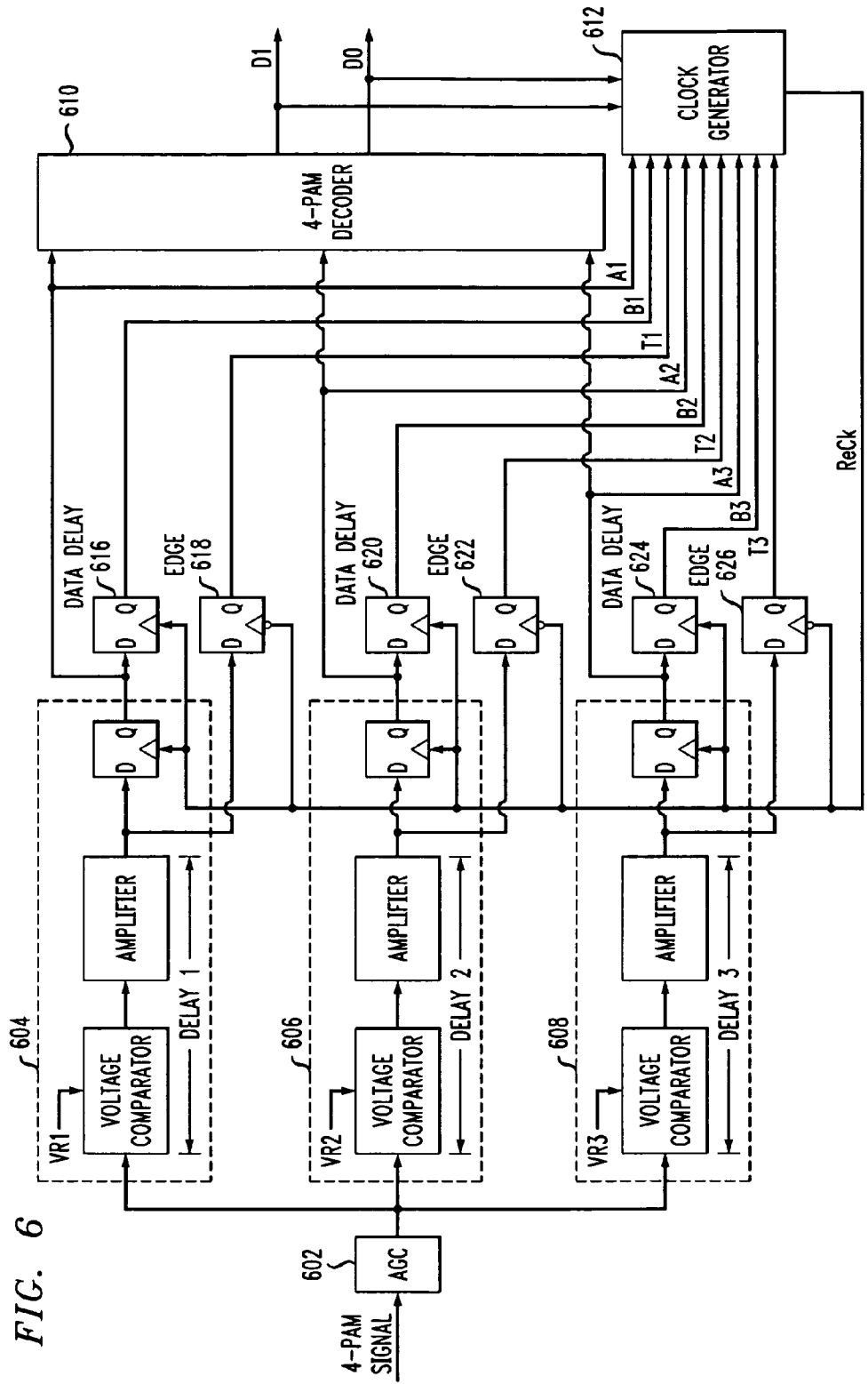
FIG. 6 is a block diagram of a 4-PAM receiver according to one embodiment of this invention.

FIG. 6 illustrates one embodiment of the present invention that addresses many of the deficiencies of the prior art.

Many of the circuit elements depicted in this embodiment also exist in FIG. 1. FIG. 6 includes AGC circuit 602, data slicers 604, 606, and 608, and 4-PAM decoder 610. Each of these circuits functions analogously to the corresponding circuits of FIG. 1. However, FIG. 6 includes edge D-FFs (618, 622, and 626) not only for the mid-amplitude slicer 606 but additionally for each of the other two slicers 604 and 608. Similarly, FIG. 6 includes data delay D-FFs (616, 620, and 624) not only for the mid-amplitude slicer 606 but additionally for each of the other two slicers 604 and 608. The outputs (B1, T1, B2, T2, B3, T3) of all six of these D-FFs in addition to the outputs (A1, A2, and A3) of all three slicers now feed a modified clock generator 612.

Modified Clock Generator

Figure 7:
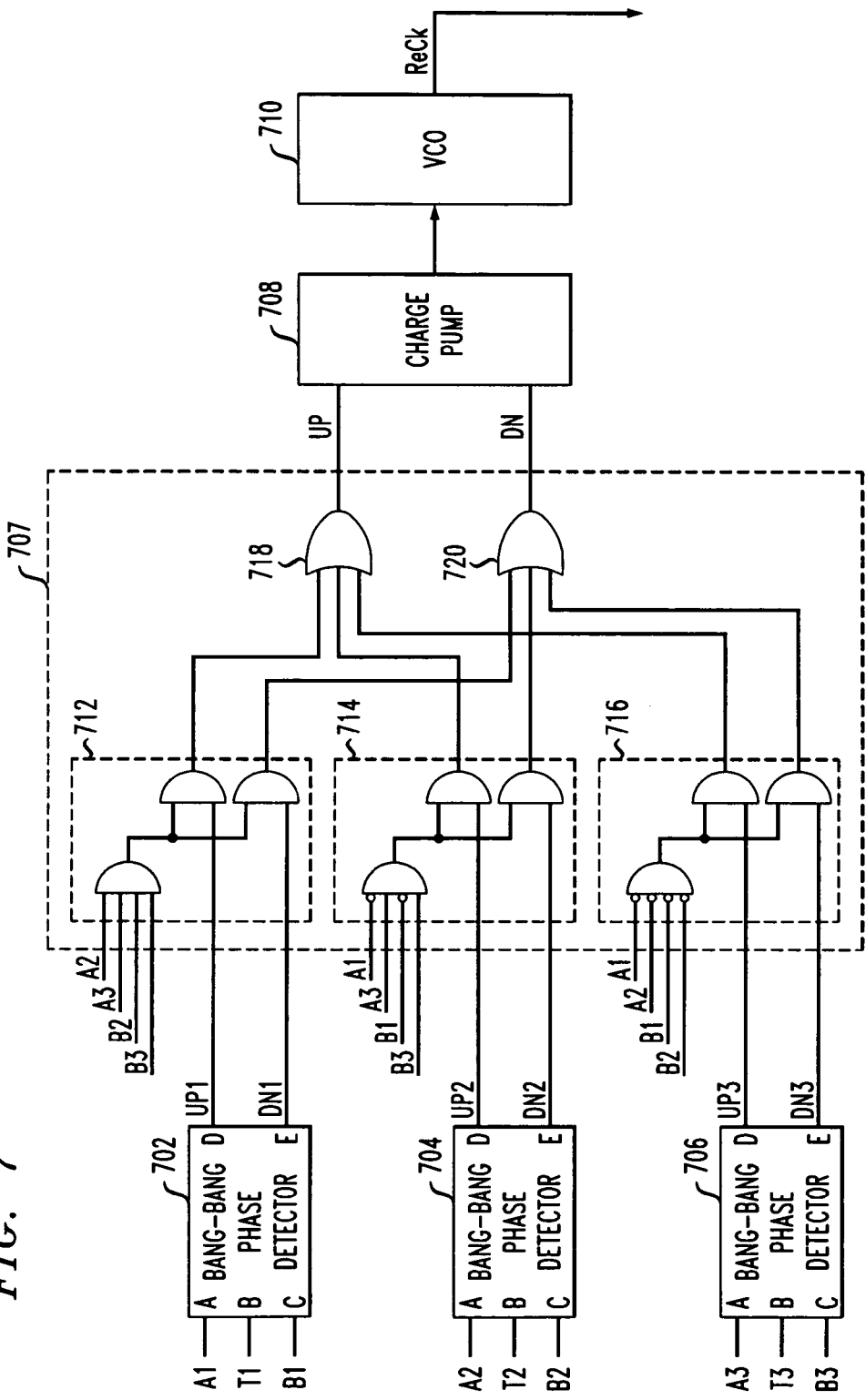
FIG. 7 is a block diagram of clock generator 612 of FIG. 6.

FIG. 7 is a block diagram of clock generator 612 of FIG. 6. It consists of three independent bang-bang phase detectors 702, 704, and 706 of the Alexander type, gating combinatorial logic 707, charge pump 708, and VCO 710. Each of the bang-bang phase detectors is fed with a 3-tuple of signals $\{A_i, T_i, B_i\}$ where i=1 corresponding to slicer 604, i=2 corresponding to slicer 606, and i=3 corresponding to slicer 608. Each phase detector operates analogously to the single bang-bang phase detector of FIG. 3 and correspondingly implements the logic of TABLE 1 of FIG. 4. The outputs of the phase detectors are further gated by surrounding combinatorial logic to only allow UP and DN signals from each phase detector to propagate to the charge pump if the transition that caused them is appropriate for that phase detector. For example, the UP1 and DN1 outputs of phase detector 702 corresponding to slicer 604 are gated by logic 712 (essentially A2 AND A3 AND B2 AND B3). Logic 712 is TRUE (i.e., the gate is open and the UP1 and DN1 signals will pass through) only when one of the current and prior symbols is 11 and the other is 10, i.e., when the prior transition was 1-10. Similarly, gating logic 714 allows UP2 and DN2 to pass through only if the last transition was 01-11, and gating logic 716 allows UP3 and DN3 to pass through only if the last transition was 00-01. The UP and DN signals from each phase detector are OR'ed together by OR gates 718 and 720, respectively, before reaching charge pump 708. Charge pump 708 in turn controls VCO 710, which generates ReCk.

With this configuration, each edge slicer contributes independently to charging or discharging the charge pump. The result of this is that ReCk tends to align to the average of the symbol edges as seen by all slicers instead of to the edge of the symbol as viewed by only one slicer. The influence of the delay difference between the edge slicers is thus minimized. This result is exemplified by the placement of ReCk (3PDs) in the timing diagram of FIG. 8.

Figure 8:
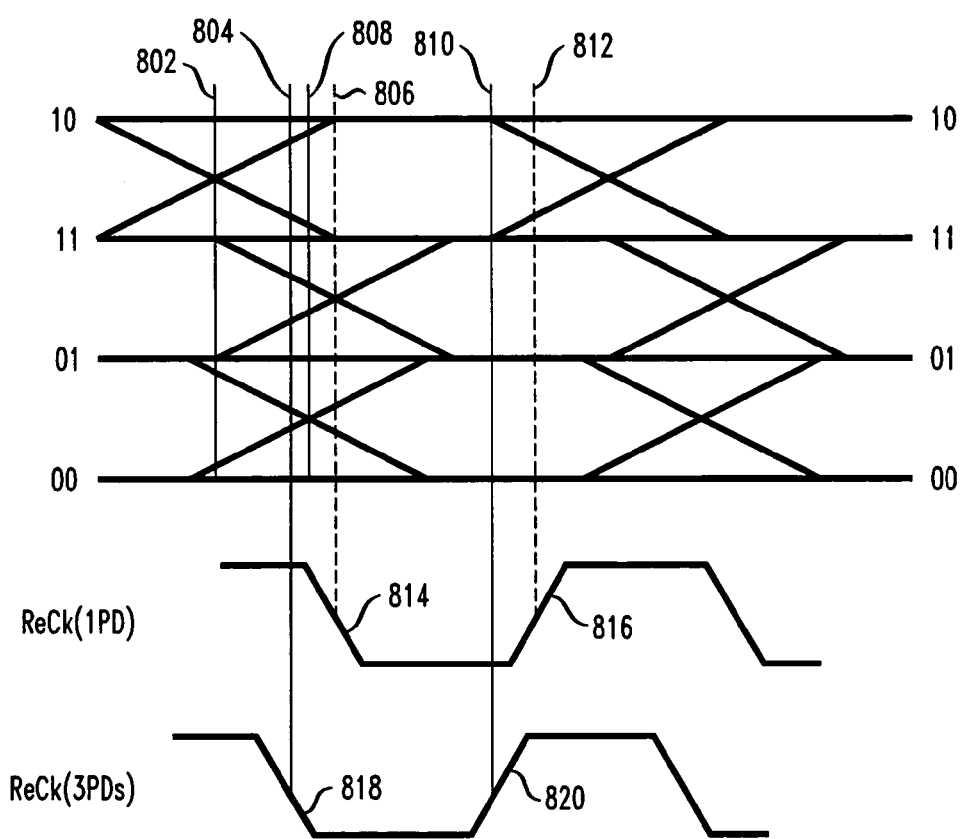
FIG. 8 is a symbol-timing diagram showing relative timing of ReCk 1PD and ReCk 3PDs.

As described before with respect to FIG. 5, in FIG. 8 the intersection of two lines in the form of an X is used to represent the center of a locus of transitions associated with the edge of a symbol as viewed by a given slicer. Reference lines 802, 806, and 808 highlight the leading edge of a symbol as viewed by the 11-10, 01-11, and 00-01 level slicers, respectively. FIG. 8 depicts the timing of the recovered clock ReCk(3PDs) as generated by the 4-PAM, multiple phase-detector receiver of FIG. 6 relative to the timing of the symbol edges. It also depicts, for comparison purposes, the relative timing of the recovered clock ReCk(1PD) as it would be generated by the single phase-detector system of FIG. 1.

Figure 5:
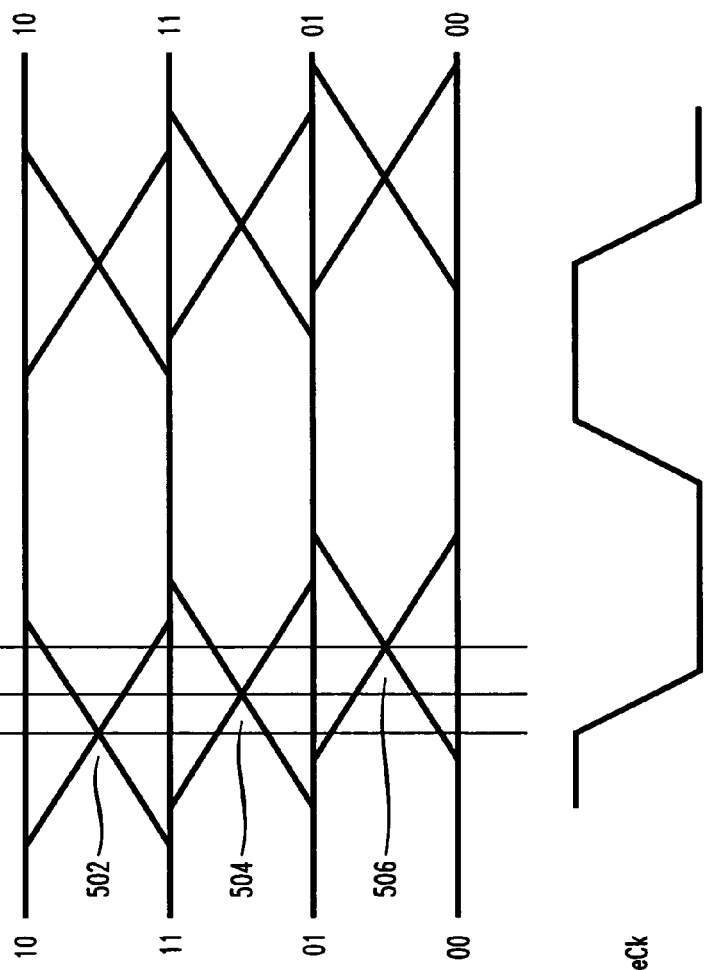
FIG. 5 is a 4-PAM symbol timing diagram.

As discussed with respect to FIG. 5, falling edge of ReCk(1PD) 814 is aligned strictly with respect to the edge of the symbol as viewed by the 01-11 slicer. This is highlighted by reference line 806. Data D-FFs of the system of FIG. 1 will thus sample the symbol at rising edge of ReCk 1PD 816, corresponding to the time of reference line 812. Notice that this sampling time falls outside the valid data region (i.e., outside the plateau) of the 1-10 slicer. This illustrates a major deficiency of the prior art at frequencies where the slicer delay differences approach the symbol interval.

In contrast, in the embodiment of FIG. 6, falling edge 818 of ReCk(3PDs), is aligned to the centroid of the edges of the symbols as seen by all three slicers. This is highlighted by reference line 804. The data D-FFs of the system of FIG. 6 will sample the symbol at rising edge of ReCk 3PDs 820, corresponding to the time of reference line 810. Notice that this sampling time falls within the valid data regions (i.e., within the plateaus) of all three slicers. Thus this embodiment of the invention avoids the problems of the prior art by aligning ReCk to an optimized estimate of the symbol edge as determined using information from all the slicers, not just one of them.

M-PAM

The concepts of this invention apply equally well to any M-PAM system. Generally this invention can be implemented as M-level pulse amplitude modulation (M-PAM) receiver circuitry including M−1 data slicers, N edge slicers, and P phase detectors ($1 \leq P \leq N \leq M$) where the outputs of the P phase detectors are combined (e.g., via weighted voting, weighted average, minimum error, and/or minimum variance) to determine an improved phase estimate for the slicers' clocks. For example, the number of data slicers is typically M−1. Per this invention, the number of edge slicers can also be M−1 or less (down to 1 in some embodiments where other aspects of the invention distinguish from the single slicer implementations of the prior art). In an N edge slicer system, some embodiments of this invention will utilize one phase detector per edge slicer. However, this may be overkill in some circumstances where the delay variances across all slicers can be sufficiently represented by samples from a fewer number of slicers within the system that exhibit typical characteristics of the rest of the slicers either as determined by a prior characterization or as estimated statistically.

Figure 9:
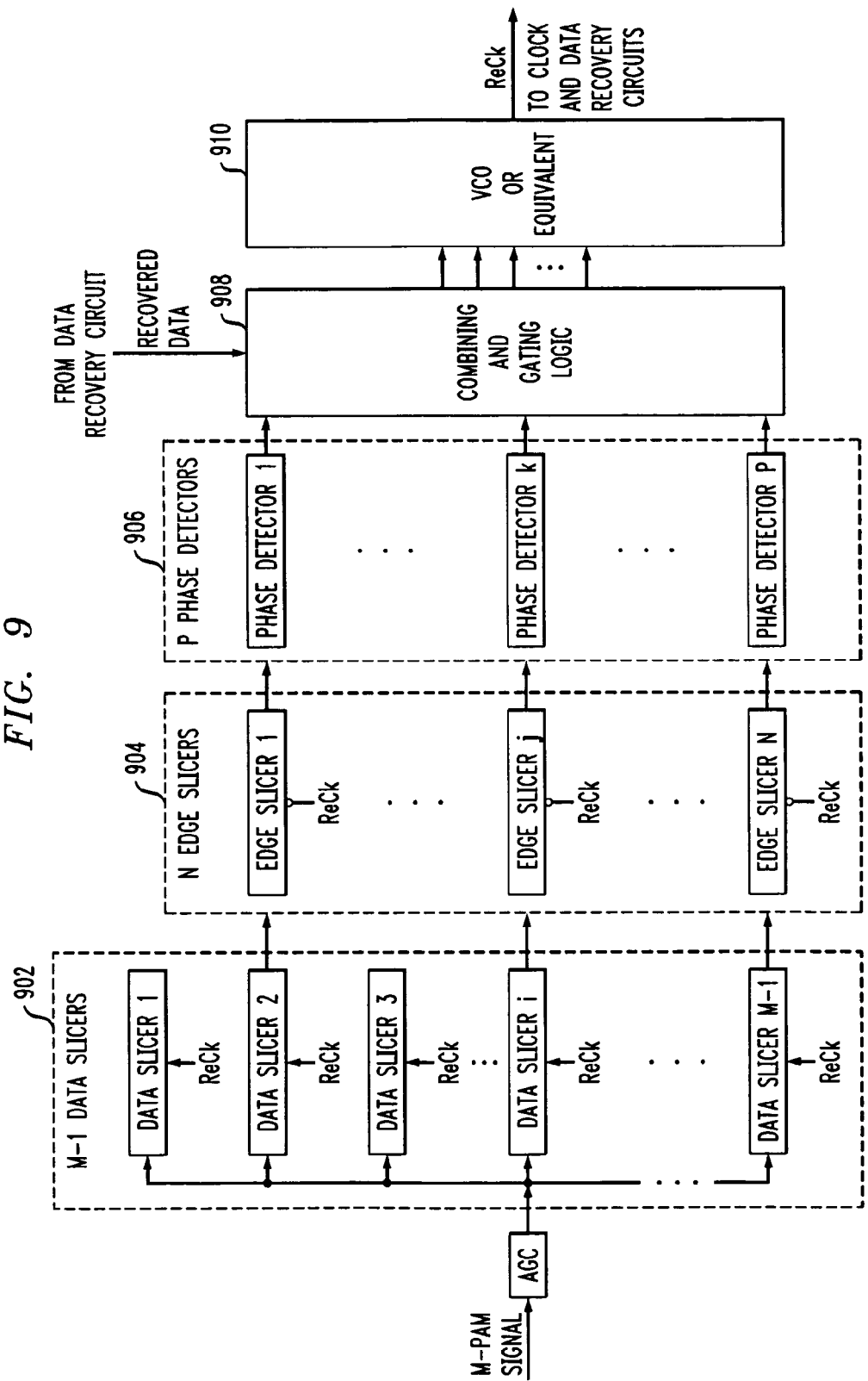
FIG. 9 is a block diagram of a multiple phase-detector, single-clock M-PAM clock recovery circuit according to one embodiment of this invention.

These embodiments are illustrated by FIG. 9, which depicts the clock recovery portion of an M-PAM receiver according to one embodiment of this invention. FIG. 9 depicts M−1 data slicers 902, the amplifier portion thereof feeding N edge slicers 904, whose outputs feed P phase detectors 906. The phase detector outputs (in addition to decoded symbols from the data recovery portion of the circuit—not shown) feed edge and data slicer combining and gating logic 908. There the relevant information from the various edge slicers is weighted according to any number of different methods including weighted average, mean distance, and smoothed weighted average. Depending on the clock generation mechanism employed in VCO or equivalent circuit 910, one or more outputs from combining and gating circuit 908 are passed to VCO circuit 910 for correction of the phase of the locally generated clock ReCk to optimize the symbol recovery phases of the data slicers 902.

Multiple Phase Detectors, Multiple Clock Generators

Up to this point, embodiments of the invention have been described that use timing information from two or more slicers to derive a single optimized clock for use by all slicers of the receiver. While this is an improvement over the prior art and represents a particular cost vs. performance compromise, additional value can be derived from circuitry which uses the timing information from two or more slicers to independently derive a plurality of clocks, each one ideally suited to the delay characteristics of one or more of the slicers. Hence, another embodiment of this invention incorporates C clock generation circuits (each of which is associated with one or more of the P phase detectors where $C \leq P$) that are used to generate an independent clock phase for each of C groups of slicers (where $C \leq N$) such that the clock phase associated with each group of slicers is optimized for the slicers within that group.

Figure 10:
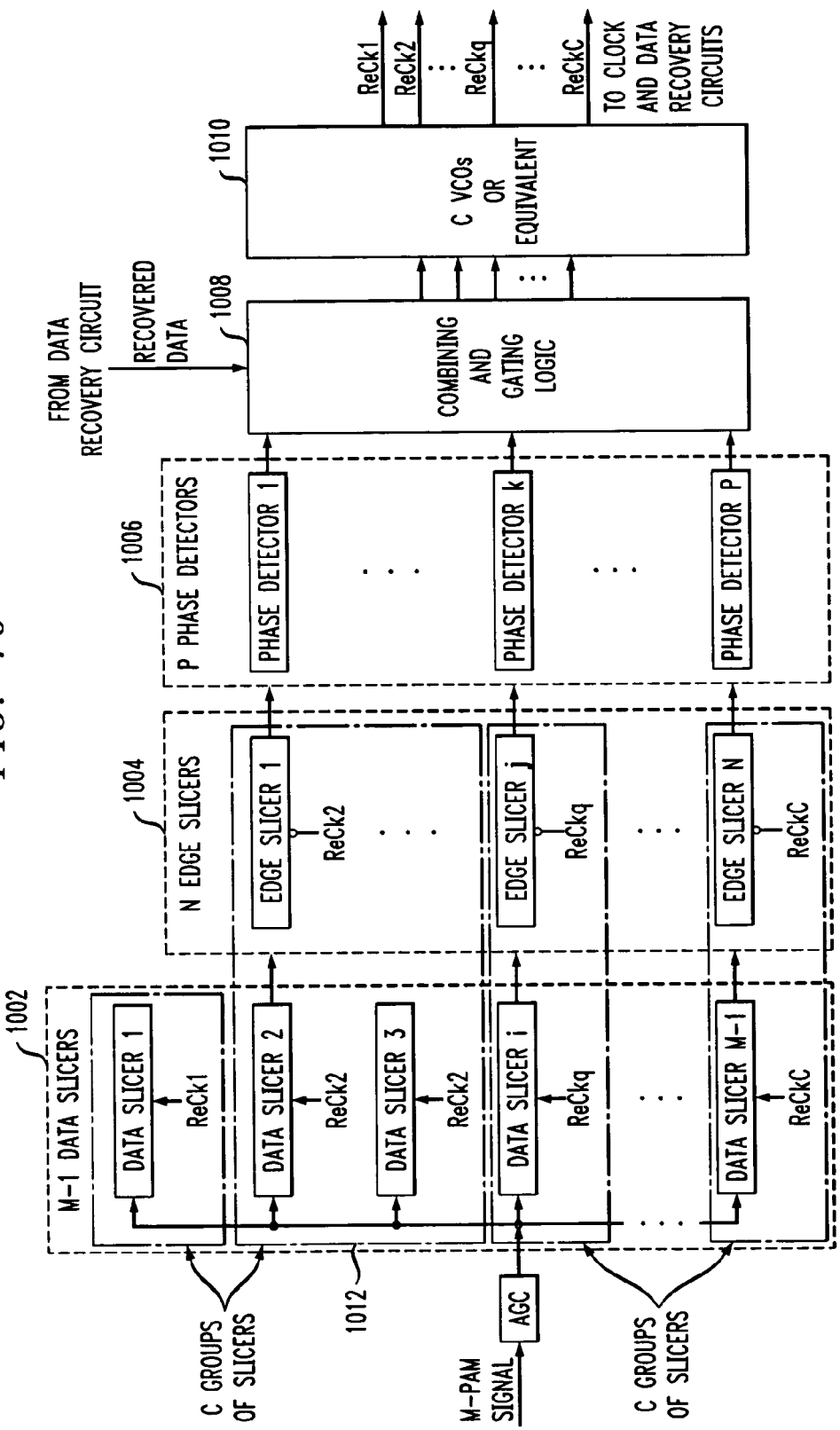
FIG. 10 is a block diagram of a multiple phase-detector, multiple-clock M-PAM clock recovery circuit according to one embodiment of this invention.

FIG. 10 illustrates this embodiment. It shows a gain-adjusted M-PAM signal feeding M−1 slicers. Data slicers 1002 and edge slicers 1004 are grouped into C groups of slicers (e.g., slicer group 1012). The N edge slicers 1004 from these groups receive outputs from the amplifiers of N of the M−1 data slicers and then feed their outputs to P phase detectors 1006. The phase detectors feed C clock generation circuits 1010 (optionally via an intervening combining and gating circuit 1008) where $C \leq P$. Each clock generation circuit generates an independent clock phase for one of C groups of slicers such that the clock phase associated with each group of slicers is optimized for the slicers within that group. For example, block 1010 is shown with C ReCk outputs, $ReCk_i$, i=1,2, . . . ,C where, for example, ReCk2 is shown driving slicer group 1012.

Multiple Phase Detectors, Multiphase Clock Generators

In yet another embodiment, each of R clock generation circuits outputs $r_i$ clock phases such that any one of the resulting Q phases, where:

$$Q = \sum_{i=1}^{R} r_i, \quad (1)$$

can be selected to drive any one or more of the C groups of slicers ($C \leq Q$). This embodiment is also illustrated by FIG. 10 where block 1010 is now understood to embody the R clock generation circuits, and selection circuitry to select C of the Q phases for output as ReCk1 . . . ReCkC.

Single Edge Slicer, Multiphase Clock Generator, and Calibration Sequence

In another embodiment illustrated by FIG. 10, only one edge slicer is employed (i.e., N=1). It feeds a single phase detector (i.e., P=1) that feeds a central multiphase clock recovery circuit (e.g., a ring oscillator with digitally controlled phase interpolator to generate the output clock phases). The multiphase clock recovery circuit, in combination with startup controller and selection logic (not explicitly shown), selects an optimal phase for each slicer group. The optimal phase for each slicer group is determined using information derived during a controlled reception scenario, for example, a special interval during which a calibration or training sequence (e.g., a priori known pseudo random sequence) is received either from the remote transmitter or via a local loopback path. This special training sequence is such that the proper result for one or more data slicers is known a priori or can be determined by a checksum code in the data. The timing of one or more of the slicer group clocks is adjusted until the bit error rates for the slicers within those slicer groups are optimized.

As an example of this last embodiment specific to a 4-PAM system, the calibration pattern 00-01, 01-11, 11-10, repeated for a consecutive run of symbols, potentially separated from the rest of the data by a known preamble, is used to exercise each slicer independently of the others. Here repeated 00-01 transitions in the training sequence exercise only the 00-01 level slicer (low slicer), repeated 01-11 transitions exercise only the 01-11 level slicer (middle slicer), and repeated 11-10 transitions exercise only the 11-10 level slicer (high slicer). An implementation that has only a single edge-slicer (associated with the middle slicer), feeding a single phase detector, feeding a single VCO can still be used to generate three phases (e.g., ReCk1, ReCk2, and ReCk3) of one recovered clock. In this implementation, the device aligns ReCk2 phase to the single edge-slicer using Alexander or equivalent techniques. Initially it drives ReCk1 and ReCk3 (corresponding to the high- and low-amplitude data slicers) with the same clock phase as ReCk2. However, during receipt of the calibration pattern, it varies each of those phases in small increments about the phase of ReCk2 until the bit-error-rates of the high and low slicers are minimized. Alternatively, as discussed previously, a known pseudo random sequence can be used during calibration. During each successive calibration sequence, additional tuning of the phases might also be performed.

Given that the relative delays of the slicers are basically fixed after implementation (other than subtle temperature dependent variations), it is possible for this calibration to be done at different times. For example, one implementation may calibrate at manufacture time, one at system configuration time, and another during operation.

Different calibration patterns can be used, however, typically, each calibration pattern would have the common characteristic of having a subpattern that was uniquely distinguishable from the rest of the data transmission (e.g., a unique word preamble) and dependent for recovery only on one of the slicers, a key slicer (e.g., middle slicer). In this way, with only the key slicer aligned, the receiver can determine that it is within a calibration sequence. Additionally, given a prior knowledge of the rest of the pattern corresponding to the other slicers or via checksum, it would be able to determine the performance of the other slicers.

This device would thus have the cost savings of a single-VCO, single-edge-slicer implementation but allow for a recovered clock that was optimized to each slicer group. The recovered phases would have fixed phase differences with respect to the key slicer and each other much like the slicer delay differences are basically fixed with respect to each other (exhibiting only minor variations with temperature) and all of these phases would track the symbol timing as a group by tracking with the key slicer.

One other variation on this embodiment is an implementation with only a single optimized ReCk, similar to the embodiment of FIG. 6, which is used for all data slicers. In this variant, however, similarly to the embodiment just discussed, only a single edge-slicer and single phase detector is used. Here, the single ReCk still tracks the key slicer, but this time by some offset. This offset is initially set to zero, where the bit error rate for the key slicer should be optimized. However, once the calibration sequence is detected, ReCk is offset ahead and behind the zero offset position in steps until BER is optimized for all slicers. A separate zero offset key edge-slicer clock feeds the edge slicer for the key slicer. This separate clock allows for proper operation of the bang-bang phase detector.

For example, in one implementation in a 4-PAM system with the middle slicer set to the key slicer, once the calibration sequence is detected, the phase is offset positively from the zero offset position by one subinterval increment and the BER is noted for all slicers. Next the phase if offset negatively from the zero offset position by one subinterval increment and the BER is noted for all slicers. Next the phase or ReCk is offset positively by two subinterval increments, and negatively by two subinterval increments. In both cases the BER is noted. This process repeats, each time incrementing the number of subinterval units the phase is offset from zero until the offset corresponding to the best overall BER is noted. One alternative implementation delays the amplifier output of the key slicer comparator corresponding to the offset delay of ReCk before it is fed to the key edge slicer. In this implementation, all slicers including the key edge slicer share the same ReCk, which is offset from the zero phase position. The edge slicers data feed is artificially delayed by this offset so that it still slices near the edge of the symbol and its output can thus still be used for the bang-bang phase detection process.

Multiple Edge Slicer, Single Clock Generator, Multiple Tap Delay Line

In yet another embodiment, a central edge slicer (i.e., mid-amplitude), phase detector, charge pump, and VCO are used to generate a single clock source that feeds a multiple-tap delay line. (The delay line may be implemented using various techniques as would be understood by one skilled in the art including multiple length microstripline approaches. Alternatively, the delay line may utilize phase interpolation between phases to produce the "taps.") The middle of the delay-line tap ("mid-tap") falling edge phase is used as the clock for the edge D-FF of the central slicer resulting in alignment of the mid-tap phase to the symbol as seen by the central slicer. Edge slicers and phase detectors from each of the non-central slicers feed a selection circuit that selects a best tap of the delay line for each of these non-central slicers.

Figure 11:
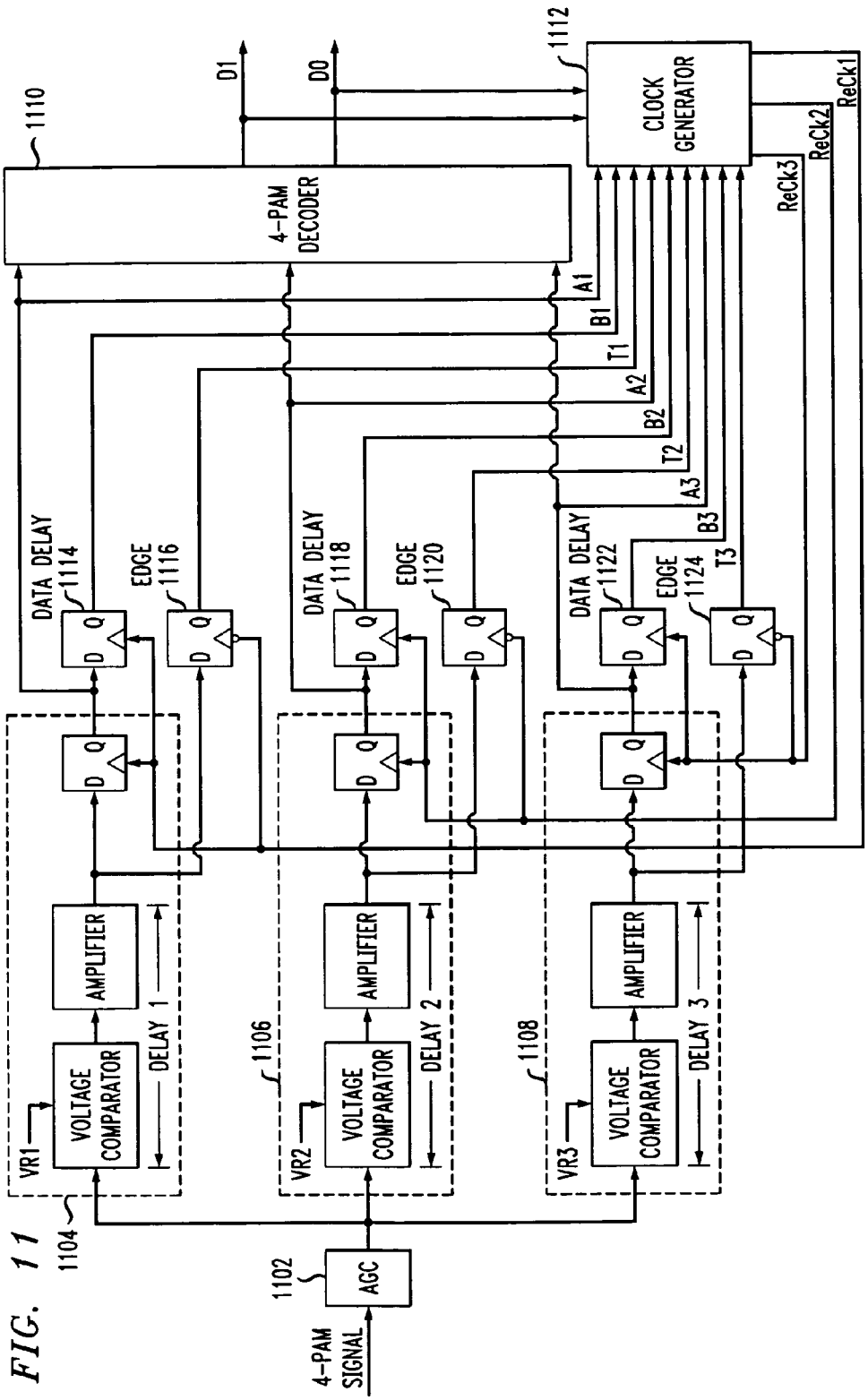
FIG. 11 is a block diagram of a multiple phase-detector, multiple-clock 4-PAM receiver according to one embodiment of this invention.
Figure 12:
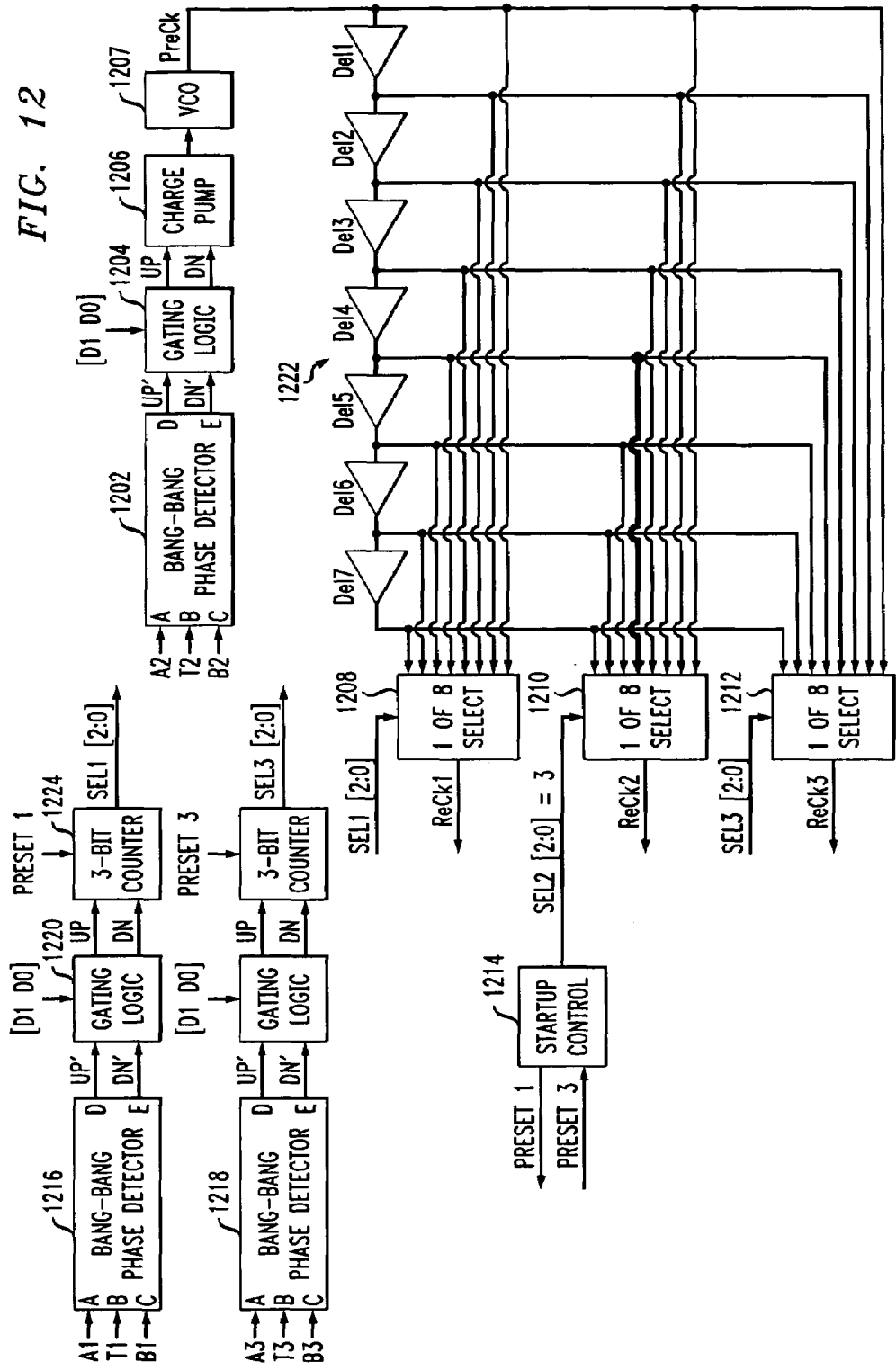
FIG. 12 is block diagram of phase detectors, phase selectors, and VCO circuit 1112 of FIG. 11.

The block diagrams of FIGS. 11 and 12 exemplify this embodiment with respect to a 4-PAM receiver. FIG. 11 is a block diagram of a multiple phase detector and multiple clock 4-PAM receiver according to one embodiment of this invention. Many of the circuit elements depicted in the embodiment shown in FIG. 11 also exist in FIG. 6. FIG. 11 includes AGC circuit 1102, data slicers 1104, 1106, and 1108, and 4-PAM decoder 1110. FIG. 11 also includes edge D-FFs (1116, 1120, and 1124) not only for the mid-amplitude slicer 1106 but also for each of the other two slicers 1104 and 1108. Again, as in FIG. 6, FIG. 11 includes data delay D-FFs (1114, 1118, and 1122) not only for the mid-amplitude slicer 1106 but also for each of the other two slicers 1104 and 1108. The outputs (B1, T1, B2, T2, B3, T3) of all six of these D-FFs, in addition to the outputs (A1, A2, and A3) of all three slicers' data D-FFs, feed clock generator 1112. Each of these circuits functions analogously to the corresponding circuits of FIG. 6 except clock generator 1112, which, as can be seen, now sources three clocks. One other difference is that these three clocks now independently clock the D-FFs corresponding to each slicer. ReCk1 clocks the D-FFs corresponding to slicer 1104, ReCk2 clocks the D-FFs corresponding to slicer 1106, and ReCk3 clocks the D-FFs corresponding to slicer 1108.

FIG. 12 is block diagram of clock generator 1112 of FIG. K. As illustrated, the signals A2, T2, and B2 corresponding to mid-amplitude slicer 1106 feed phase detector 1202, which uses these signals to generate UP' and DN' (i.e., clock is fast and clock is slow) pulses according to the logic of TABLE 1 of FIG. 3 as described earlier. Pulses that are relevant to the mid-amplitude slicer are gated to the charge pump via gating control logic 1204 based on the current and last states of the outputs [D1 D0] of 4-PAM decoder block 1110. The gated UP and DN outputs feed charge pump 1206, which in turn controls the phase of the output, PreCk, of VCO 1207. PreCk is fed to series 1222 of delay elements, Del1–Del7, each of which delays the clock by some fraction (e.g., $1/40^{th}$ or no greater than $1/5$ of the anticipated slicer delay mismatch, whichever is smaller) of the symbol interval.

Each of the delay outputs, as well as PreCk itself is tapped and fed to one input of each of three 8-to-1 clock selectors 1208, 1210, and 1212. Note that clock selector 1212 is set in this example by startup control 1214 to initially select input 3 and thus connects the output of delay tap Del4 to selector 1210 output ReCk2. Referring back to FIG. 11, ReCk2 is seen to clock the D-FFs of the mid-amplitude slicer, thus completing the path of the clock recovery loop that began at phase detector 1202. This loop will serve to align the falling edge of the ReCk2 to the edge of a symbol as viewed by mid-amplitude slicer 1106. Since ReCk2 is connected to the clock that is output from the mid-tap delay of series 1222 of delay elements (i.e., the output of Del4), the result of this loop's operation is to align the falling edge of the clock that is output from Del4 to the edge of the symbol interval as seen by the mid-amplitude slicer.

So far, the mechanism has been described that generates ReCk2. This mechanism yields a clock that is ideally aligned with respect to an input symbol as seen by mid-amplitude slicer 1106. It is thus also ideally suited to clock the mid-amplitude data slicer's D-FF for data recovery.

Given that the delay of each of Del1–Del7 is roughly $1/40$th the symbol interval (or no greater than $1/5$ of the anticipated slicer delay mismatch, whichever is smaller), and that the output of Del3 is aligned to the symbol edge as seen by the mid-amplitude slicer, it should be clear that the timing of the falling edges of the clocks out of taps 1222 form a cluster of clock edges around ReCk2 (4 earlier phases and 3 later phases). As discussed previously with respect to FIG. 6, the delay differences between slicers are a data-rate-limiting aspect of prior art M-PAM systems. As we saw before, these delay differences cause the ideal sampling time for those slicers other than the mid-amplitude slicer to vary about the mid-amplitude slicer's ideal sampling time. By controlling the clock selectors 1208 and 1212 to choose the appropriate relatively delayed phase, the phase detector and clock recovery circuit of FIG. 12 can optimize sampling times for all three slicers with a single VCO circuit.

For example, in order to select the proper phase for ReCk1, the outputs (A1, B1, and T1) of the data, data delay, and edge D-FFs, respectively, of slicer 1104, which are clocked by ReCk1, are fed to phase detector 1216. As before, the phase detector determines whether the current phase of ReCk1 (preset by startup control circuit 1214 to be the same as ReCk2) is early (fast) or late (slow) with respect to the edge of the symbol as seen by slicer 1104. If ReCk1 is early, phase detector 1216 pulses its UP' signal which (if passed through gating logic 1220) causes counter LO to count up. The output count (synonymous with SEL1[2:0]) is incremented and thus selector 1208 chooses a later phase with respect to that of ReCk2 from among series 1222 of tap outputs. If ReCk2 is late, phase detector 1216 pulses its DN' signal which (if passed through gating logic 1220) causes counter LO to count down. The output count is decremented and thus selector 1214 chooses an earlier phase with respect to that of ReCk2 from among series 1222 of tap outputs. The selection of ReCk3 is done identically, only it is phase aligned appropriately to the symbol as seen by slicer 1108. Startup control 1214 in this example sets ReCk2 to Del4 (roughly the center of the delay line) and presets the counters to effect the same initial phase selection for ReCk1 and ReCk3 as that which is hardwired for ReCk2 (i.e., the output of Del4).

Note that the relative delays of the slicers do not vary too greatly over time and temperature. As such, alternative embodiments allow for the selectors to be calibrated and fixed in fabrication, the factory, or on an initial configuration of the system. The selector positions could also be initially determined and then set via a programmable ROM or DIPswitch arrangement as well. Other alternative implementations include coupling ReCk2 to PreCk or coupling ReCk2 with one of the taps of the delay line potentially through another circuit element that has delay characteristics similar to the selector (i.e., to avoid the use of a clock selector associated with the central data and edge slicer clock).

Since the slicer delay differences are relatively small, it should be sufficient to provide only a few clock taps in the delay line since it is not necessary to cover the entire symbol interval, but only a cluster of differences around ReCk2. This concept can be applied to any M-PAM system.

While this invention has been described with reference to illustrative embodiments, this description should not be construed in a limiting sense.

Other variations on the system include the use of a phase-locked loop as a substitute or in addition to VCO circuitry to align the phases of the local clocks. Additional mechanisms for clock generation include improvements to allow smooth phase interpolation beyond the first quadrant are set forth in Larsson 25-1, Larsson 26-13-2, and in Yang, F., O'Neill, J., et al., "A 1.5V 86 mW/ch 8-Channel 622–3125 Mb/s/ch CMOS SerDes macrocell with Selectable Mux/Demux Ratio," ISSCC 2002, Feb. 4, 2002, also incorporated herein by reference in its entirety.

Various implementations of the slicers described can be utilized within the scope of this invention. As described, a slicer includes a comparator and amplification element. In some implementations, the amplification element is integrated with the comparator function. In other cases, the comparator output range is directly applicable to the logic levels of the D-FFs. It should also be noted that the sampling element described for purpose of example as a D-FF is more generally any element which can capture the state of the comparator (or 1-bit A/D) output. Such elements include set-reset flip-flops (SR flip flops) and JK flip flops, as well as capacitive transient storage elements such as a dynamic RAM cell and other elements for temporary storage that would be understood to one skilled in the art.

Various modifications of the described embodiments, as well as other embodiments of the invention, which are apparent to persons skilled in the art to which the invention pertains are deemed to lie within the principle and scope of the invention as expressed in the following claims.

The present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

What is claimed is:

1. Apparatus for processing an M-level signal, M>2, comprising:
    (a) a plurality of data slicers, each adapted to data sample the M-level signal relative to a threshold level between a different adjacent pair of symbol levels;
    (b) two or more edge slicers, each adapted to edge sample the M-level signal relative to a threshold level between a different adjacent pair of symbol levels;
    (c) a clock generator adapted to generate at least one clock signal based on outputs from the two or more edge slicers, wherein the at least one clock signal determines the timing of the data sampling of the M-level signal by at least one of the plurality of data slicers.

2. The invention of claim 1, wherein:
    the apparatus comprises M–1 edge slicers; and
    the clock generator is adapted to generate a single clock signal based on the outputs from the M–1 edge slicers.

3. The invention of claim 1, wherein the clock generator is adapted to generate two or more clock signals, each clock signal based on the outputs from a different subset of one or more edge slicers.

4. The invention of claim 3, wherein each clock signal is based on the outputs from a different subset of two or more edge slicers.

5. The invention of claim 1, wherein:
    each data slicer comprises:
        (a) a voltage comparator adapted to compare the M-level signal to the corresponding threshold level; and
        (b) a data sampler adapted to data sample the output of the voltage comparator during data plateaus in the M-level signal; and
    each edge slicer comprises an edge sampler adapted to edge sample the output of a corresponding voltage comparator near data transitions in the M-level signal.

6. The invention of claim 5, wherein each data and edge sampler is a D-type flip-flop.

7. The invention of claim 1, wherein the clock generator comprises:
    (a) a phase detector corresponding to each edge slicer and adapted to generate an early/late signal indicating whether the edge slicer sampled the M-level signal before or after a data transition;
    (b) gating logic adapted to filter the early/late signals from the phase detectors to discriminate between different types of data transitions; and
    (c) clock circuitry adapted to generate the at least one clock signal based on the filtered signals from the gating logic.

8. The invention of claim 7, wherein:
    each phase detector is a bang-bang phase detector adapted to generate up and down signals based on the output from the corresponding edge slicer and the outputs from the corresponding data slicer for current and previous symbol intervals in the M-level signal;
    the gating logic is adapted to filter the up and down signals based on the outputs from at least two data slicers for the current and previous symbol intervals; and
    the clock circuitry comprises:
        (i) a charge pump adapted to accumulate charge based on the filtered up and down signals; and
        (ii) at least one VCO adapted to generate the at least one clock signal based on the accumulated charge.

9. The invention of claim 1, wherein the clock generator comprises:
    a tapped delay line,
    one or more clock selectors,
    two or more phase detectors associated with the edge slicers, and
    selection control logic, wherein:

a first clock is generated as a function of one or more of the edge slicers, this first clock is fed to one end of the tapped delay line, one or more taps of the tapped delay line feed at least one clock selector, the selection control logic is configured to control at least one of the clock selectors in response to one or more of the edge slicers, and the output of at least one clock selector is used as a sampling clock for at least one of the data slicers.

10. A method for processing an M-level signal, M>2, comprising:
 (a) data sampling the M-level signal relative to each of a plurality of threshold levels, each threshold level between a different adjacent pair of symbol levels in the M-level signal;
 (b) edge sampling the M-level signal relative to each of two or more threshold levels using two or more edge slicers, each threshold level between a different adjacent pair of symbol levels; and
 (c) generating at least one clock signal based on outputs from the two or more edge slicers, wherein the at least one clock signal determines the timing of the data sampling of at least one of the M-level signals.

11. The invention of claim 10, wherein generating the at least one clock signal comprises generating a single clock signal based on outputs from M−1 edge slicers.

12. The invention of claim 10, wherein generating the at least one clock signal comprises generating two or more clock signals, each clock signal based on the outputs from a different subset of one or more edge slicers.

13. The invention of claim 12, wherein each clock signal is based on different subsets of the outputs from two or more edge slicers.

14. The invention of claim 10, wherein data sampling the M-level signal comprises:
 (a) comparing the M-level signal to the corresponding threshold level; and
 (b) data sampling the result of the comparison during data plateaus in the M-level signal; and
 (c) edge sampling the result of the comparison near data transitions in the M-level signal.

15. The invention of claim 14, wherein each data and edge sampler is a D-type flip-flop.

16. The invention of claim 10, wherein generating at least one clock signal comprises:
 (a) generating an early/late signal indicating whether the edge slicer sampled the M-level signal before or after a data transition;
 (b) filtering the early/late signals to discriminate between different types of data transitions; and
 (c) generating the at least one clock signal based on the filtered signals.

17. The invention of claim 16, comprising:
 generating up and down signals based on the output from the corresponding edge slicer and the outputs from the corresponding data slicer for current and previous symbol intervals in the M-level signal;
 filtering the up and down signals based on the outputs from at least two data slicers for the current and previous symbol intervals; and
 accumulating charge based on the filtered up and down signals; and
 using at least one VCO to generate the at least one clock signal based on the accumulated charge.

18. The invention of claim 10, wherein generating at least one clock signal comprises:
 generating a reference clock that is a function of at least one edge detector,
 feeding a delay line with the reference clock,
 tapping the delay line at intervals that are a subdivision of the clock period,
 feeding one or more of the taps to one or more clock selectors,
 controlling the selected output of at least one of the clock selectors via selection control logic wherein the selection control logic is a function of one or more edge slicer outputs.

* * * * *